United States Patent
Sekine

(10) Patent No.: US 9,806,294 B2
(45) Date of Patent: Oct. 31, 2017

(54) SURFACE LIGHT EMITTING ELEMENT

(71) Applicant: Konica Minolta, Inc., Chiyoda-ku, Tokyo (JP)

(72) Inventor: Koujirou Sekine, Ibaraki (JP)

(73) Assignee: KONICA MINOLTA, INC., Chiyoda-Ku, Tokyo (JP)

(*) Notice: Subject to any disclaimer, the term of this patent is extended or adjusted under 35 U.S.C. 154(b) by 0 days.

(21) Appl. No.: 14/780,284

(22) PCT Filed: Mar. 14, 2014

(86) PCT No.: PCT/JP2014/056855
§ 371 (c)(1),
(2) Date: Sep. 25, 2015

(87) PCT Pub. No.: WO2014/156714
PCT Pub. Date: Oct. 2, 2014

(65) Prior Publication Data
US 2016/0079566 A1    Mar. 17, 2016

(30) Foreign Application Priority Data
Mar. 28, 2013  (JP) .................................. 2013-068698

(51) Int. Cl.
H01L 51/52  (2006.01)

(52) U.S. Cl.
CPC ...... H01L 51/5268 (2013.01); H01L 51/5206 (2013.01); H01L 51/5221 (2013.01);
(Continued)

(58) Field of Classification Search
CPC ............ H01L 51/5628; H01L 51/5206; H01L 51/5221; H01L 51/5271; H01L 2251/53; H01L 2251/5307
See application file for complete search history.

(56) References Cited

U.S. PATENT DOCUMENTS 8,835,960 B2 *  9/2014  Nakamura .......... H01L 51/5268
                                                                257/98
9,365,767 B2 *  6/2016  Yabe ..................... C09K 11/06
(Continued)

FOREIGN PATENT DOCUMENTS

JP    2004014530 A    1/2004
JP    2004127942 A    4/2004
(Continued)

OTHER PUBLICATIONS

Written Opinion of the International Searching Authority corresponding to Application No. PCT/JP2014/056855; dated Apr. 22, 2014, with English translation.
(Continued)

Primary Examiner — Jose R Diaz
(74) Attorney, Agent, or Firm — Cantor Colburn LLP

(57) ABSTRACT

A surface light emitting element includes a light emitting layer that emits light, a first electrode layer that is provided on the side of the light emitting layer from which the light is extracted and allows the light that has been emitted by the light emitting layer to pass through, a second electrode layer that is provided on the side of the light emitting layer from which light is not extracted, a light scattering layer that is provided on the side of the first electrode layer opposite to the side on which the light emitting layer is positioned, and a transparent substrate that is provided on the side of the light scattering layer opposite to the side on which the light emitting layer is positioned, wherein a conductive material in which the real part of a complex dielectric constant is negative is used in the first electrode layer.

9 Claims, 14 Drawing Sheets

(52) U.S. Cl.
CPC .... *H01L 51/5271* (2013.01); *H01L 2251/301* (2013.01); *H01L 2251/5307* (2013.01)

(56) References Cited

U.S. PATENT DOCUMENTS

| | | |
|---|---|---|
| 2001/0019242 A1 | 9/2001 | Tada et al. |
| 2004/0061136 A1 | 4/2004 | Tyan et al. |
| 2005/0073228 A1 | 4/2005 | Tyan et al. |
| 2013/0187141 A1 | 7/2013 | Nakamura et al. |

FOREIGN PATENT DOCUMENTS

| | | |
|---|---|---|
| JP | 2011054583 A | 3/2011 |
| JP | 2012204017 A | 10/2012 |
| WO | 2012057043 A1 | 5/2012 |
| WO | 2012115034 A1 | 8/2012 |

OTHER PUBLICATIONS

International Search Report corresponding to Application No. PCT/JP2014/056855; dated Apr. 22, 2014, with English translation.

* cited by examiner

"PRIOR ART"

"PRIOR ART"

FIG. 26

| | REFLECTIVE METAL | | OPTICAL TRANSPARENT LAYER | TRANSPARENT ELECTRODE | | CHARGE TRANSPORT LAYER | LIGHT EMITTING LAYER | CHARGE TRANSPORT LAYER | TRANSPARENT ELECTRODE | | PRIMER LAYER | SUBSTRATE | DISTANCE D1 FROM LIGHT EMITTING POINT TO REFLECTIVE METAL | DISTANCE D2 FROM LIGHT EMITTING POINT TO THIN METAL ELECTRODE | MODE RATE | | | EXTRACTION OF LIGHT |
|---|---|---|---|---|---|---|---|---|---|---|---|---|---|---|---|---|---|---|
| | MATERIAL | CHARACTERISTIC | | MATERIAL | CHARACTERISTIC | | | | MATERIAL | CHARACTERISTIC | | | | | PLASMON | WAVEGUIDE | AIR + SUBSTRATE | |
| RELEVANT ART 1 | Al | CATHODE | - | - | - | ELECTRON TRANSPORT LAYER | Alq | HOLE TRANSPORT LAYER | ITO | ANODE | - | GLASS | 100 nm | - | 24% | 20% | 50% | 38% |
| RELEVANT ART 2 | Al | REFLECTIVE LAYER | ORGANIC LAYER | ITO | CATHODE | ELECTRON TRANSPORT LAYER | Alq | HOLE TRANSPORT LAYER | ITO | ANODE | - | GLASS | 140 nm | - | 23% | 38% | 34% | 39% |
| EMBODIMENT 1 | Al | CATHODE | - | - | - | ELECTRON TRANSPORT LAYER | Alq | HOLE TRANSPORT LAYER | Ag | ANODE | - | GLASS | 85 nm | 40 nm | 23% | 0% | 65% | 48% |
| EMBODIMENT 2 | Al | CATHODE | - | - | - | ELECTRON TRANSPORT LAYER | Alq | HOLE TRANSPORT LAYER | Ag | ANODE | ORGANIC LAYER | GLASS | 85 nm | 40 nm | 23% | 0% | 65% | 48% |
| EMBODIMENT 3 | Al | REFLECTIVE LAYER | ORGANIC LAYER | ITO | CATHODE | ELECTRON TRANSPORT LAYER | Alq | HOLE TRANSPORT LAYER | Ag | ANODE | - | GLASS | 140 nm | 40 nm | 18% | 40% | 29% | 41% |
| EMBODIMENT 4 | Al | REFLECTIVE LAYER | ORGANIC LAYER | ITO | CATHODE | ELECTRON TRANSPORT LAYER | Alq | HOLE TRANSPORT LAYER | Ag | ANODE | ORGANIC LAYER | GLASS | 140 nm | 40 nm | 19% | 50% | 29% | 42% |
| EMBODIMENT 5 | Al | REFLECTIVE LAYER | ORGANIC LAYER | THIN SILVER | CATHODE | ELECTRON TRANSPORT LAYER | Alq | HOLE TRANSPORT LAYER | Ag | ANODE | - | GLASS | 140 nm | 40 nm | 19% | 0% | 62% | 47% |
| EMBODIMENT 6 | Al | REFLECTIVE LAYER | ORGANIC LAYER | THIN SILVER | CATHODE | ELECTRON TRANSPORT LAYER | Alq | HOLE TRANSPORT LAYER | Ag | ANODE | ORGANIC LAYER | GLASS | 140 nm | 40 nm | 19% | 0% | 63% | 47% |
| EMBODIMENT 7 | Al | ANODE | - | - | - | HOLE TRANSPORT LAYER | Alq | ELECTRON TRANSPORT LAYER | Ag | CATHODE | - | GLASS | 85 nm | 40 nm | 23% | 0% | 65% | 48% |
| EMBODIMENT 8 | Al | ANODE | - | - | - | HOLE TRANSPORT LAYER | Alq | ELECTRON TRANSPORT LAYER | Ag | CATHODE | ORGANIC LAYER | GLASS | 85 nm | 40 nm | 23% | 0% | 65% | 48% |
| EMBODIMENT 9 | Al | REFLECTIVE LAYER | ORGANIC LAYER | ITO | ANODE | HOLE TRANSPORT LAYER | Alq | ELECTRON TRANSPORT LAYER | Ag | CATHODE | - | GLASS | 140 nm | 40 nm | 18% | 40% | 29% | 41% |
| EMBODIMENT 10 | Al | REFLECTIVE LAYER | ORGANIC LAYER | ITO | ANODE | HOLE TRANSPORT LAYER | Alq | ELECTRON TRANSPORT LAYER | Ag | CATHODE | ORGANIC LAYER | GLASS | 140 nm | 40 nm | 19% | 50% | 29% | 42% |
| EMBODIMENT 11 | Al | REFLECTIVE LAYER | ORGANIC LAYER | THIN SILVER | ANODE | HOLE TRANSPORT LAYER | Alq | ELECTRON TRANSPORT LAYER | Ag | CATHODE | - | GLASS | 140 nm | 40 nm | 19% | 0% | 62% | 47% |
| EMBODIMENT 12 | Al | REFLECTIVE LAYER | ORGANIC LAYER | THIN SILVER | ANODE | HOLE TRANSPORT LAYER | Alq | ELECTRON TRANSPORT LAYER | Ag | CATHODE | ORGANIC LAYER | GLASS | 140 nm | 40 nm | 19% | 0% | 63% | 47% |
| EMBODIMENT 13 | Al | CATHODE | - | - | - | ELECTRON TRANSPORT LAYER | Alq | HOLE TRANSPORT LAYER | AgMg | ANODE | - | GLASS | 85 nm | 40 nm | 22% | 0% | 60% | 45% |
| EMBODIMENT 14 | Al | CATHODE | - | - | - | ELECTRON TRANSPORT LAYER | Alq | HOLE TRANSPORT LAYER | Au | ANODE | - | GLASS | 85 nm | 40 nm | 23% | 0% | 61% | 46% |

SURFACE LIGHT EMITTING ELEMENT

CROSS REFERENCE TO RELATED APPLICATIONS

This is the U.S. national stage of application No. PCT/JP2014/056855, filed on Mar. 14, 2014. Priority under 35 U.S.C. §119(a) and 35 U.S.C. §365(b) is claimed from Japanese Application No. 2013-068698, filed Mar. 28, 2013, the disclosure of which is also incorporated herein by reference.

TECHNICAL FIELD

The present invention relates to a structure of a surface light emitting element.

BACKGROUND ART

A surface light emitting element is exemplified as a novel light source. In order to improve a light extraction efficiency in a surface light emitting element, optimization of the structure of the light extraction efficiency has been considered.

One of the causes of the loss of light that has been generated in a surface light emitting element is plasmon loss that is caused by the adjacency of a light emitting layer and a metal electrode. In this plasmon loss, the loss can be decreased by distancing the light emitting layer from the metal electrode. It is also possible to decrease plasmon loss by adopting a structure having thick organic functional layers (for example, an electron transport layer and the like), or a structure in which a transparent electrode is interposed between a light emitting layer and a metal electrode.

When the cause of plasmon loss is decreased, the cause of decrease of an efficiency by a waveguide mode is increased. In order to solve the problem in a waveguide mode, light is extracted by providing a diffraction grating and a scattering layer.

JP 2004-14530 A (Patent Literature 1) discloses a structure of an organic EL element in which a light scattering layer having a high refractive index is provided to the side of a transparent electrode from which light is extracted. JP 2004-127942 A (Patent Literature 2) discloses a structure of an organic light-emitting diode device of a high light extraction type, in which transparent electrodes are provided to the top and bottom of a light emitting layer, and a light scattering layer is provided to between the side of the transparent electrode from which light is extracted, and a substrate.

CITATION LIST

Patent Literatures

Patent Literature 1: JP 2004-14530 A
Patent Literature 2: JP 2004-127942 A

SUMMARY OF INVENTION

Technical Problem

Since the expansion of the demand for surface light emitting elements is expected to expand in the future, it is important to develop a novel surface light emitting element that can improve a light extraction efficiency in a surface light emitting element.

The object of the present invention is to provide a surface light emitting element having a structure that can further improve a light extraction efficiency.

Solution to Problem

In order to attain at least one of the above-mentioned objects, a surface light emitting element that reflects an aspect of the present invention includes: a light emitting layer that emits light; a first electrode layer that is provided on the side of the light emitting layer from which the light is extracted and allows the light that has been emitted by the light emitting layer to pass through; a second electrode layer that is provided on the side of the light emitting layer from which light is not extracted; a light scattering layer that is provided on the side of the first electrode layer opposite to the side on which the light emitting layer is positioned; and a transparent substrate that is provided on the side of the light scattering layer opposite to the side on which the light emitting layer is positioned, wherein a conductive material in which the real part of a complex dielectric constant is negative is used in the first electrode layer.

BRIEF DESCRIPTION OF DRAWINGS

FIG. 26 is a drawing showing the light extraction efficiencies of the surface light emitting elements in Relevant Arts 1 and 2 and Embodiments 1 to 14.

DESCRIPTION OF EMBODIMENTS

Figure 1:
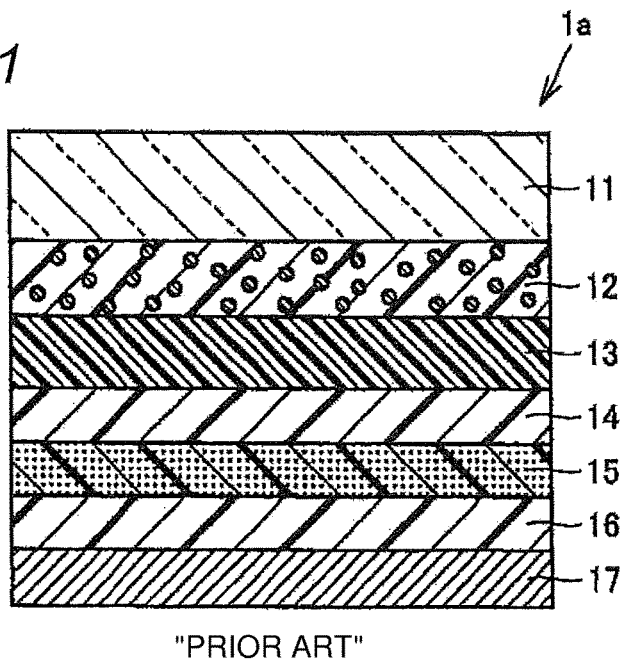
FIG. 1 is a cross-sectional surface view showing the structure of a surface light emitting element in Relevant Art 1.

The surface light emitting elements in the respective embodiments based on the present invention will be explained below with referring to the drawings. In the embodiments explained below, in the cases when a number, an amount and the like are referred to, the scope of the present invention is not necessarily limited to the number, amount and the like unless otherwise described. An identical reference number is provided to an identical part and a corresponding part, and an overlapping explanation is not repeated in some cases. It has been expected from the first that the constitutions in the respective embodiments are suitably combined and used.

(Relevant Arts 1 and 2)

The surface light emitting elements 1a and 2a in Relevant Art 1 and 2 will be explained with referring to FIGS. 1 and 2, before the explanation of the structures of the surface light emitting elements in the respective embodiments based on the present invention.

(Relevant Art 1: Surface Light Emitting Element 1a)

Firstly, the surface light emitting element 1a in Relevant Art 1 will be explained with referring to FIG. 1. FIG. 1 is a cross-sectional surface view showing the structure of the surface light emitting element 1a in Relevant Art 1.

This surface light emitting element 1a has a rectangular shape in a plane view, and includes a light emitting layer 15 that emits light, and a hole transport layer 14 that allows the light that has been emitted by the light emitting layer 15 to pass through, and a first electrode layer (transparent anode) 13, a light scattering layer 12, and a transparent substrate 11, which are laminated in this order on the surface of one side of the light emitting layer 15 (the side from which the light is extracted: the upper side of the drawing).

An electron transport layer 16 and a metal cathode layer (reflective electrode) 17 are laminated in this order on the surface of the other side of the light emitting layer 15 (the side from which light is not extracted: the lower side of the drawing).

The transparent substrate 11 becomes a substrate having a main surface on which the above-mentioned respective layers are to be formed, and is constituted by an insulating element that allows fine transmission of the light in the visible light region. The transparent substrate 11 may be either a rigid substrate or a flexible substrate. The transparent substrate 11 is constituted by, for example, a glass substrate, a plastic plate, a polymer film, a silicon plate or a laminate plate thereof, or the like in view of the above-mentioned light transmission. In this embodiment, a glass substrate having a thickness of about 5 mm was used.

The light scattering layer 12 is constituted by an insulating film that allows fine transmission of the light in the visible light region, and has a function to allow a part of the light to scatter. It is preferable that the light scattering layer 12 has a higher refractive index than that of the transparent substrate 11. Specifically, as the light scattering layer 12, for example, a light scattering layer in which a PMMA resin (refractive index n=1.5) mixed with $TiO_2$ microparticles (refractive index n=2.2) having a particle size of about 50 nm (the substantial refractive index n of the entirety is about 1.8) is incorporated as a binder, and PMMA resin microparticles (refractive index n=1.5) having a particle size of about 500 nm as a filler are further incorporated can be utilized. A hollow silica having a particle size of about 500 nm (the refractive index n of the hollow part=1.0) may also be used as a filler instead of the above-mentioned PMMA resin microparticles having a particle size of about 500 nm.

The first electrode layer (transparent anode) 13 is constituted by a film that allows fine transmission of light at the visible light region and shows fine electroconductivity. Specifically, the first electrode layer (transparent anode) 13 is constituted by, for example, an inorganic conductive film such as a film of ITO (a mixed form of indium oxide and tin oxide), a film of IZO (a mixed form of indium oxide and a zinc oxide film), a ZnO film, a CuI film or a $SnO_2$ film, an organic conductive film such as a film, of PEDOT/PSS (a mixed form of polyethylenedioxythiophene and polystyrenesulfonic acid), a composite conductive film in which a silver nanowire, a carbon nanotube or the like is dispersed in a polymer material, or the like. In the case when the first electrode layer (transparent anode) 13 is constituted by an ITO film (refractive index n=about 1.8 to 2.2), the thickness is set to, for example, about 100 nm.

The hole transport layer 14 transports holes from the first electrode layer (transparent anode) 13 to the light emitting layer 15. As the hole transport material in the hole transport layer 14, for example, a triazole derivative or an oxadiazole derivative or the like can be used. The hole transport layer 14 has a refractive index n=about 1.7 to 1.9, and a typical value used herein is n=1.8. The layer has a thickness of about 40 nm.

The light emitting layer 15 is an organic electric field light emitting layer, includes at least a light emitting layer composed of a fluorescence compound or a phosphorescence compound, and is constituted by a film that allows fine transmission of light at the visible light region. As the light emitting layer 15, for example, a laminate film containing an organic material as represented by Alq3 (tris(8-quinolinolato)aluminum) (each respective film has a refractive index n=1.7 to 1.9 (a refractive index n as a representative value=1.8), and a thickness of about 30 nm) can be preferably utilized.

As the material of the light emitting layer 15, an organic metal complex may be used in view of the improvement of the external quantum efficiency of the surface light emitting element 1a, the extension of the light emission lifetime, and the like. As the metal element for the formation of the complex as used herein is preferably any one of metals or Al, Zn belonging to Group VIII, Group IX and Group X of the elemental periodic table, especially preferably Ir or Pt, Al, Zn.

The electron transport layer 16 has a function to transport the electrons that have been injected from the metal cathode layer 17 to the light emitting layer 15. As the electron transport material in the electron transport layer 16, for example, a nitro-substituted fluorene derivative, or a diphenylquinone derivative, or the like can be used. The electron transport layer 16 has a refractive index n=about 1.7 to 1.9, and a representative value herein is n=1.8. The thickness is, for example, about 40 nm to 200 nm.

For the metal cathode layer 17, for example, one or more kind of metal element selected from Al, Ag, In, Ti, Cu, Au, Mg, Mo, W and Pt can be used. In this embodiment, Al was used, and the thickness thereof was set to, for example, about 100 nm.

For the surface light emitting element, the following four modes are present: an air mode in which the light that has been emitted from the light emitting layer exits and goes into the air, a substrate mode in which the light is enclosed by the total reflection of the transparent substrate and the air, a waveguide mode in which the light is enclosed by the transparent anode and/or the light emitting layer, and a plasmon mode in which the light is localized especially in the metal cathode layer in the waveguide mode.

The light that can be actually used is the light that is extracted into the air. The light in the substrate mode is partially extracted into the air by the multiple reflection between the transparent substrate 11 and the metal cathode layer 17 by attaching a light extraction sheet to the surface of the transparent substrate 11 on the air side. The lights at the waveguide mode and plasmon mode cannot be utilized.

The typical ratio of the respective modes is 20% of the air mode, 30% of the substrate mode, 10% of the waveguide mode, and 40% of the plasmon mode. The lights at the waveguide mode and plasmon mode cannot be extracted even if a light extraction sheet is utilized.

The cause of the plasmon mode is that the light emitting point in the light emitting layer 15 (the central position in the thickness direction of the light emitting layer 15) is close to the metal cathode layer 17. The plasmon mode can be decreased by distancing the light emitting point from the surface of the metal cathode layer 17.

In the surface light emitting element, it is possible to distance the light emitting point from the surface of the metal cathode layer by making the thickness of the electron transport layer between the light emitting layer and the metal cathode layer sufficiently thick. However, if the thickness of the electron transport layer is made too thick, the electrical properties (resistance, carrier balance) of the electron transport layer are deteriorated.

As a method for extracting the lights at the waveguide mode and substrate mode by light scattering, a method including imparting a light scattering function to the layer at the light extraction side is exemplified. In the surface light emitting element 1a shown in FIG. 1, the lights that have been taken into the waveguide mode and substrate mode are scattered by inserting the light scattering layer 12 in between the transparent substrate 11 and the transparent anode 13, whereby the light extraction efficiency is improved.

(Relevant Art 2: Surface Light Emitting Element 2a)

Figure 2:
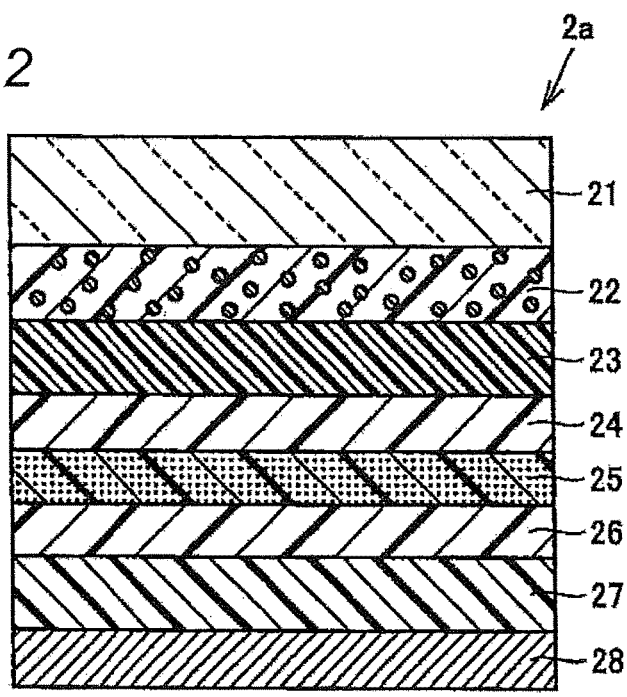
FIG. 2 is a cross-sectional surface view showing the structure of a surface light emitting element in Relevant Art 2.

FIG. 2 shows a surface light emitting element 2a in Relevant Art 2. As in the above-mentioned constitution of the surface light emitting element 1a, this surface light emitting element 2a includes a light emitting layer 25 that emits light, and a hole transport layer 24 that allows the light that has been emitted from the light emitting layer 25 to pass through, and a first electrode layer (transparent anode) 23, a light scattering layer 22, and a transparent substrate 21, which are laminated in this order on the surface of the light emitting layer 25 on one side (light extracting side: the upper side of the drawing).

An electron transport layer 26, a transparent cathode layer 27 and a light reflective metal layer 28 are laminated in this order on the surface of the light emitting layer 25 on the other side (the side from which light is not extracted: the lower side of the drawing). The transparent cathode layer 27 is provided so as to distance the light emitting point from the surface of the light reflective metal layer 28. This transparent cathode layer 27 is constituted by a film that allows fine transmission of the light at the visible light region and shows a fine electroconductivity as in the first electrode layer (transparent anode) 23.

The transparent cathode layer 27 is constituted by, for example, an inorganic conductive film such as a film of ITO (a mixed form of indium oxide and tin oxide), a film of IZO (a mixed form of indium oxide and a zinc oxide film), a ZnO film, a CuI film or a SnO$_2$ film, an organic conductive film such as a film of PEDOT/PSS (a mixed form of polyethylenedioxythiophene and polystyrenesulfonic acid), a composite conductive film in which a silver nanowire, a carbon nanotube or the like is dispersed in a polymer material, or the like.

In the case when the transparent cathode layer 27 is constituted by an ITO film (refractive index n=about 1.8 to 2.2), the thickness is set to, for example, about 50 nm. Since the absorption of the light by the materials cannot be neglected if the transparent cathode layer 27 is also thickened, a laminate structure with the first electrode layer (transparent anode) 23 is preferable.

The light reflective metal layer 28 is constituted by, for example, a metal film composed of Al, Ag, Ni, Ti, Na, Ca or an alloy containing any of these, or the like (for example, thickness: about 100 nm).

The light scattering layer 22 has an effect to allow the light at the waveguide mode guided by the first electrode layer (transparent anode) 23, light emitting layer 25 and the like to scatter in the transparent substrate 21 and to scatter the light at the substrate mode in the air by moving the light scattering layer 22 closer to the first electrode layer (transparent anode) 23 at the light extraction side.

In either of the constitutions of the surface light emitting element 1a shown in FIG. 1 and the surface light emitting element 2*a* shown in FIG. 2, the intensity of bonding to the plasmon mode, which is the maximal cause of light loss, closely relates to an electrical field intensity at the position of a light emitting point in an electrical field distribution of the plasmon mode.

The plasmon mode has a maximum intensity on a metal surface, and has a distribution that attenuates in a logarithmic functional manner toward the transparent substrate through the light emitting layer. If the electrical field intensity at the light emitting point can be decreased, then the bonding to the plasmon mode can be decreased. However, since the refractive indices n of the light emitting layer and transparent electrode cannot vary significantly, and typically has a refractive index n=about 1.8 to 2.2. Therefore, in order to decrease the plasmon mode, it is effective to distance the metal from light emitting point as far as possible.

(Embodiment 1: Surface Light Emitting Element 3*a*)

Figure 3:
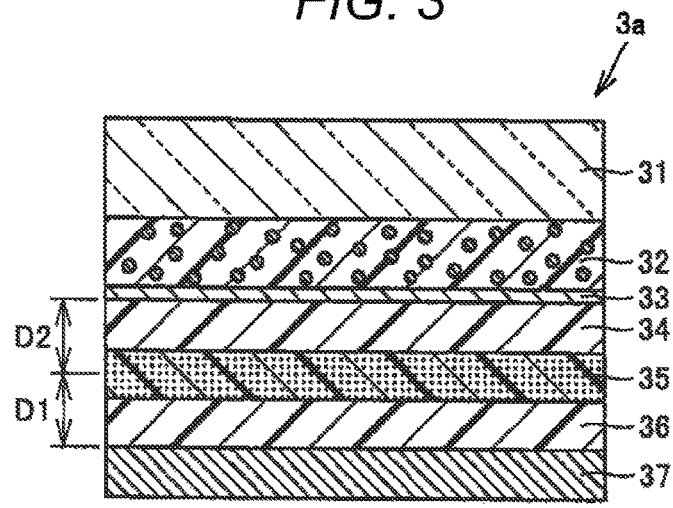
FIG. 3 is a cross-sectional surface view showing the structure of a surface light emitting element in Embodiment 1.

Subsequently, the surface light emitting element 3*a* in Embodiment 1 will be explained with referring to FIG. 3. FIG. 3 is a cross-sectional surface view showing the structure of the surface light emitting element 3*a* in Embodiment 1. This surface light emitting element 3*a* has a basic constitution (material, layer thickness) that is identical with that of the surface light emitting element 1*a* in the Relevant Art 1 shown in FIG. 1, and includes a light emitting layer 35 that emits light, and a hole transport layer 34 that allows the light that has been emitted from the light emitting layer 35 to pass through, and a first electrode layer (transparent anode) 33, a light scattering layer 32, and a transparent substrate 31, which are laminated in this order on the surface on one side of this light emitting layer 35 (the side from which light is extracted: the upper side of the drawing).

An electron transport layer 36 and a metal cathode layer (reflective electrode) 37 are laminated in this order on the surface of the other side of the light emitting layer 35 (the side from which light is not extracted: the lower side of the drawing).

The difference from Relevant Art 1 is that a thin silver layer (Ag, thickness: 8 nm) is used for the first electrode layer (transparent anode) 33. In the case when a thin silver layer is used, the electrical field distribution seems to have a non-continuous shape. In a thin silver layer in which the real part of a complex dielectric constant is negative under a boundary condition determined by the Maxwell's equation, the electrical field distribution has dependency that is reverse from decrease in a logarithmic functional manner. Due to this dependency, the light electrical field distribution has a shape in which the electrical field intensity around the emitting point has been decreased.

The factor such that the electrical field intensity around the light emitting point is decreased is preferably a large negative absolute value of the real part of the complex dielectric constant of the thin silver layer part. In the case when the distance D2 from the light emitting point (the central position of the light emitting layer 35 in the thickness direction; the same applies hereinafter) to the surface of the first electrode layer (transparent anode) 33 and the distance D1 from the light emitting point to the metal cathode layer 37 is identical, the electrical field intensity at the light emitting point necessarily decreases. This means that the bond efficiency to the plasmon mode is decreased, and thus it becomes possible to decrease the cause of the lowering of the maximum light extracting efficiency.

However, even in the case when the loss at the plasmon mode is decreased, in the case when a waveguide mode generated at the light emitting layer and the like is present, the light is only converted to the waveguide mode, and thus the light cannot be extracted into the air in this form.

By forming the light scattering layer 32 so as to be adjacent to the first electrode layer (transparent anode) 33, it becomes possible to convert the waveguide mode to the substrate mode and to convert the substrate mode to the air mode, and thus it becomes possible to convert the improve the final light extraction efficiency.

The waveguide mode is put into a condition under which the mode itself cannot be present if the thickness of the high refractive index layer is sufficiently thin (about ¼ or less of the wavelength). If ITO is not used but a thin silver layer is used in the first electrode layer (transparent anode) 33, and the film thickness of the organic layer is thin, then the waveguide mode cannot be present.

In the conversion of the waveguide mode to the substrate mode by the high refractive index scattering layer, since the transmission distance of the waveguide mode (the transmission distance at which the intensity is 1/e) is limited, it is impossible to convert the entirety of the waveguide mode to the substrate mode. The efficiency is about 30 to 70%, and as the refractive index of the high refractive index layer increases (the light emitting layer that constitutes the waveguide mode, the electrical charge transport layer (the electron transport layer 36, the hole transport layer 34), close to ITO), the efficiency increases.

On the other hand, with respect to the efficiency to convert the substrate mode to the air mode, as the refractive index of the high refractive index scattering layer increases, the ratio of being enclosed in the high refractive index scattering layer under a total reflection condition increases, and thus a lower refractive index of the high refractive index scattering layer is more preferable.

The high refractive index scattering layer has a function to convert the waveguide mode to the substrate mode and to convert the substrate mode to the air mode, and the refractive indices that are advantageous for the respective modes are in a conflicting requirement. Therefore, it is desirable that the refractive index of the high refractive index scattering layer is not too high.

The first electrode layer (transparent anode) 33 is constituted by silver (Ag) or an alloy containing silver (Ag) as a main component. Examples of the alloy containing silver (Ag) as a main component include silver-magnesium (AgMg), silver-copper (AgCu), silver-palladium (Aged), silver-palladium copper (AgPdCu), silver-indium (AgIn) and the like. A constitution in which a layer of silver or the alloy containing silver (Ag) as a main component is divided into a plurality of layers as necessary and laminated is also preferable. Either of these materials is a conductive material in which the real part of a complex dielectric constant is negative as in silver.

Figure 4:
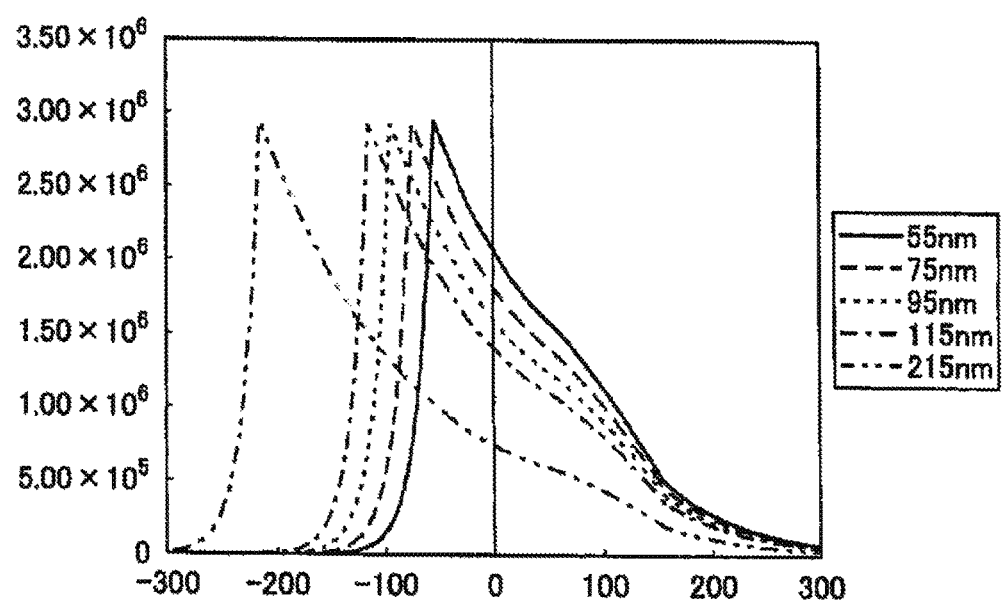
FIG. 4 is a drawing showing the change in the electrical field amplitude in the case when the distance between the light emission central point and the metal cathode in the surface light emitting element of Relevant Art 1 is changed.

FIG. 4 is a drawing showing the electrical field amplitude in the case when the distance between the light emission central point and the metal cathode layer 17 is changed in the surface light emitting element 1*a* of Relevant Art 1. The horizontal axis represents the distance from the light emitting point, and the transparent substrate 11 is present on the right side. The electrical field amplitude at the light emitting point decreases as the distance to the transparent substrate 11 is extended (55 nm, 75 nm, 95 nm, 115 nm, 215 nm).

Figure 5:
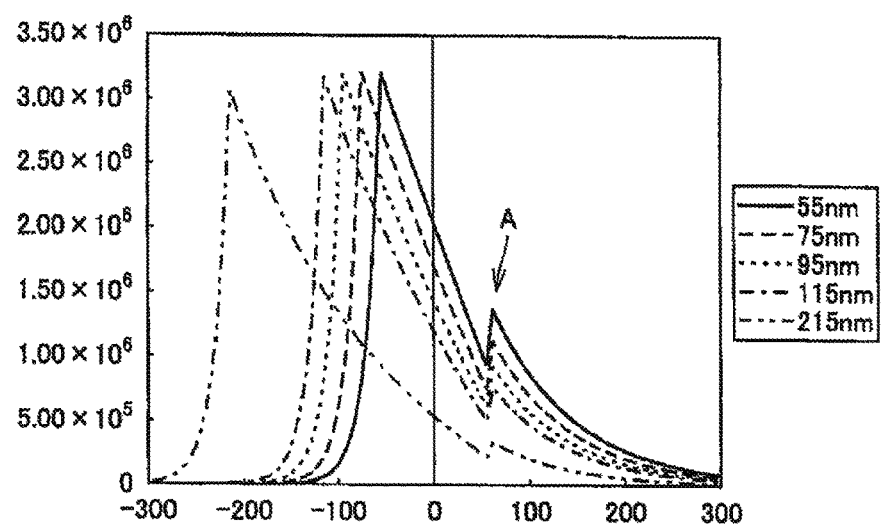
FIG. 5 is a drawing showing the change in the electrical field amplitude in the case when the distance between the light emission central point and the metal cathode in the surface light emitting element of Embodiment 1 is changed.
Figure 6:
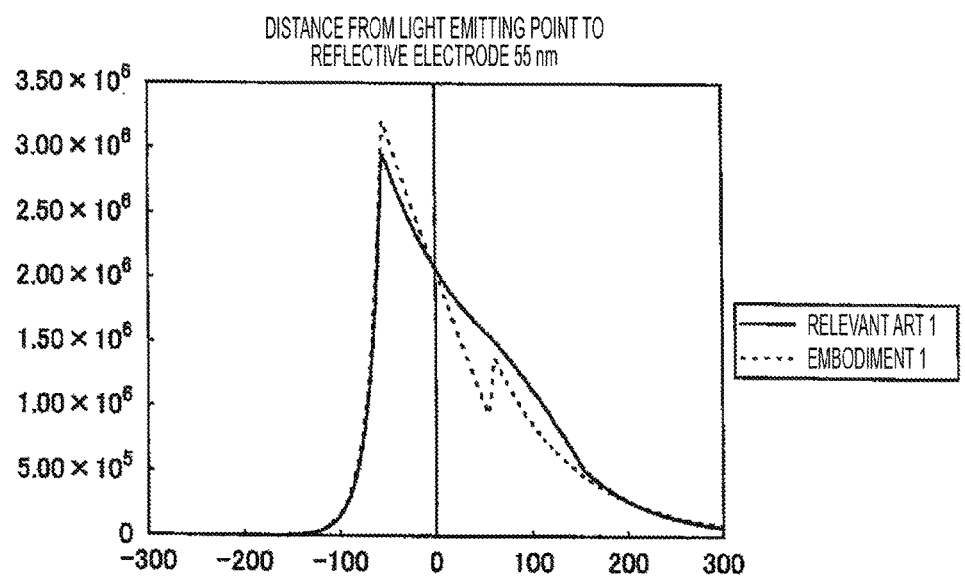
FIG. 6 is a drawing showing the changes in the electrical field amplitudes of Relevant Art 1 and Embodiment 1 in the case when the distance between the light emission central point and the metal cathode is 55 nm.
Figure 7:
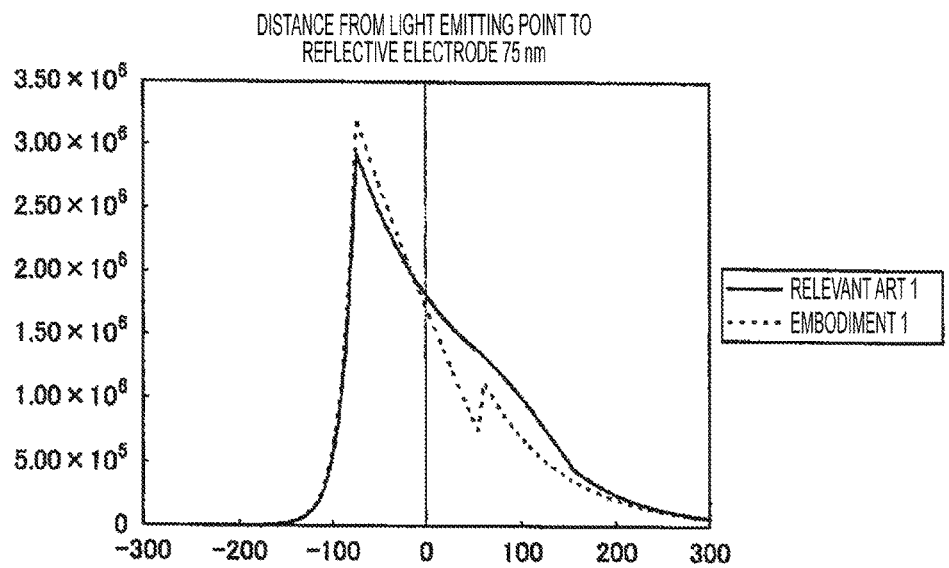
FIG. 7 is a drawing showing the changes in the electrical field amplitudes of Relevant Art 1 and Embodiment 1 in the case when the distance between the light emission central point and the metal cathode is 75 nm.
Figure 8:
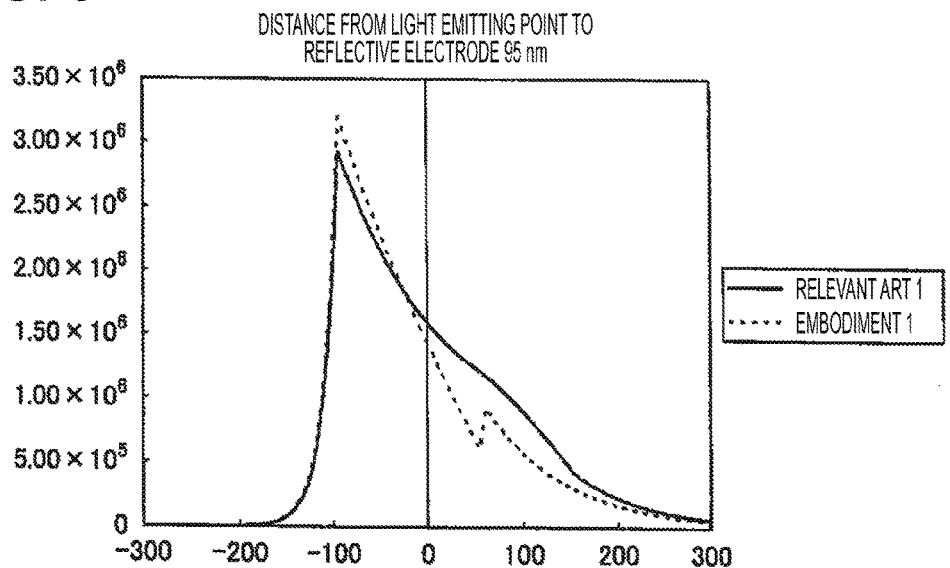
FIG. 8 is a drawing showing the changes in the electrical field amplitudes of Relevant Art 1 and Embodiment 1 in the case when the distance between the light emission central point and the metal cathode is 95 nm.
Figure 9:
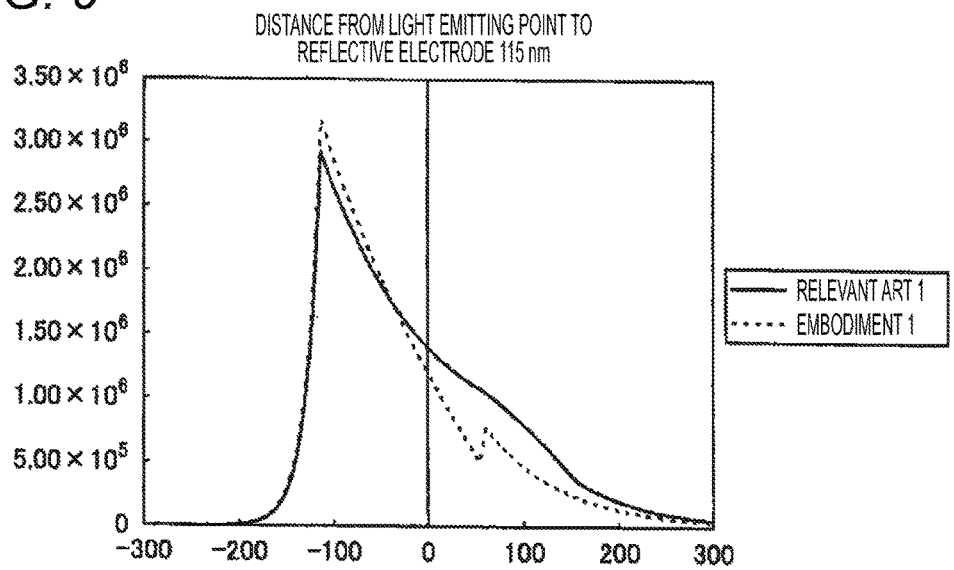
FIG. 9 is a drawing showing the changes in the electrical field amplitudes of Relevant Art 1 and Embodiment 1 in the case when the distance between the light emission central point and the metal cathode is 115 nm.

FIG. 5 is a drawing showing the electrical field amplitude when the distance from the light emitting point to the surface of the metal cathode layer 37 is changed in the surface light emitting element 3*a* of Embodiment 1. The horizontal axis represents the distance from the light emitting point, and the transparent substrate 11 is present on the right side. The electrical field amplitude at the light emitting point decreases as the distance to the transparent substrate 11 is extended (55 nm, 75 nm, 95 nm, 115 nm, 215 nm).

In the case of the surface light emitting element 3a in Embodiment 1, it is understood that the electrical field amplitude around the light emitting point decreased more than that in Relevant Art 1 in all cases, due to the noncontiguous shape of the electrical field by the first electrode layer (transparent anode) 33 using thin silver which is present at around the coordinate around 55 nm (the part indicated by the arrow A).

FIGS. 6 to 10 are graphs in which the electrical field amplitudes are compared between the case of the surface light emitting element 1a in Relevant Art 1 and the case of the surface light emitting element 3a in Embodiment 1, in the cases when the distance from the light emitting point to the surface of the metal cathode layer 37 is 55 nm (FIG. 6), 75 nm (FIG. 7), 95 nm (FIG. 8), 115 nm (FIG. 9) and 215 nm (FIG. 10), and the electrical field amplitude at the light emitting point decreased more in the surface light emitting element 3a in Embodiment 1 in all cases.

Figure 10:
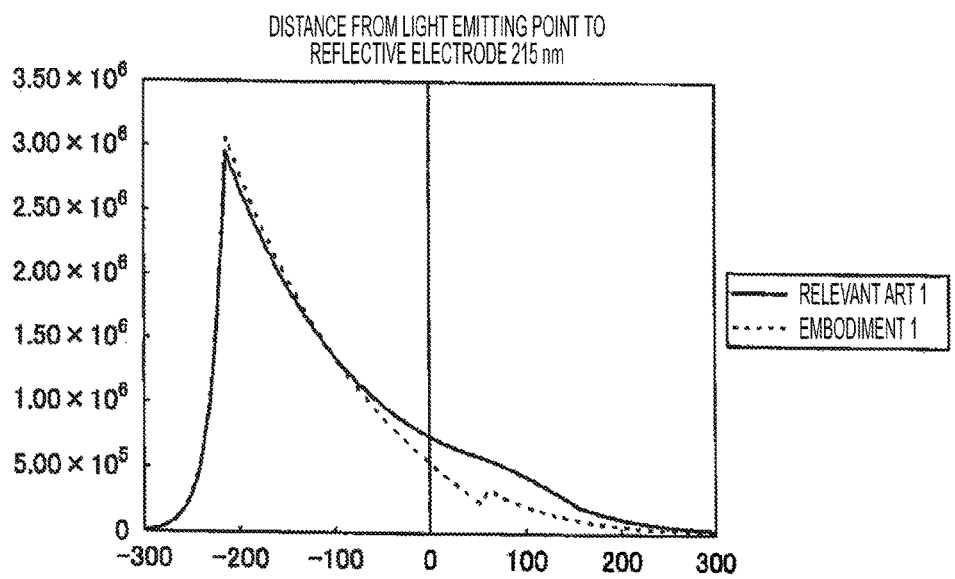
FIG. 10 is a drawing showing the changes in the electrical field amplitudes of Relevant Art 1 and Embodiment 1 in the case when the distance between the light emission central point and the metal cathode is 215 nm.
Figure 11:
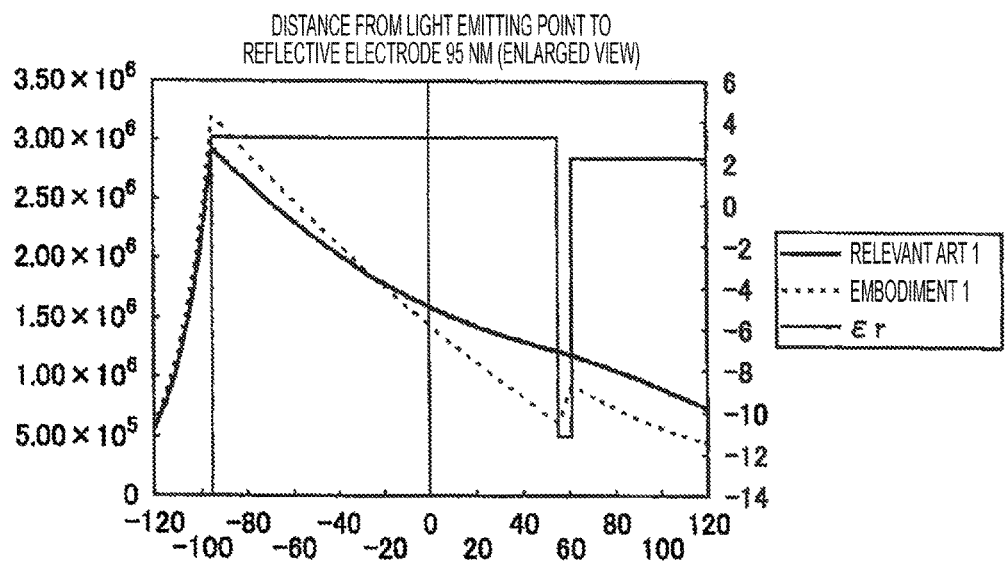
FIG. 11 is a partial enlarged view around the light emission central point of FIG. 10.

FIG. 11, which is an enlarged view of FIG. 10, also shows the real part of the complex dielectric constant of the first electrode layer (transparent anode) 33 using the surface light emitting element 3a in Embodiment 1. The first electrode layer (transparent anode) 33 is present in the vicinity of 60 nm from the light emitting point in the direction of the transparent substrate 31. Since the real part of the complex dielectric constant of thin silver is significantly negative, the intensity of the electrical field distribution that is present in the thin silver increases in the direction of the transparent substrate 31, which is opposite to the surroundings. Therefore, the entire mode shape becomes a noncontiguous shape so as to decrease the electrical field distribution of the light emitting point around the first electrode layer (transparent anode) 33.

Figure 12:
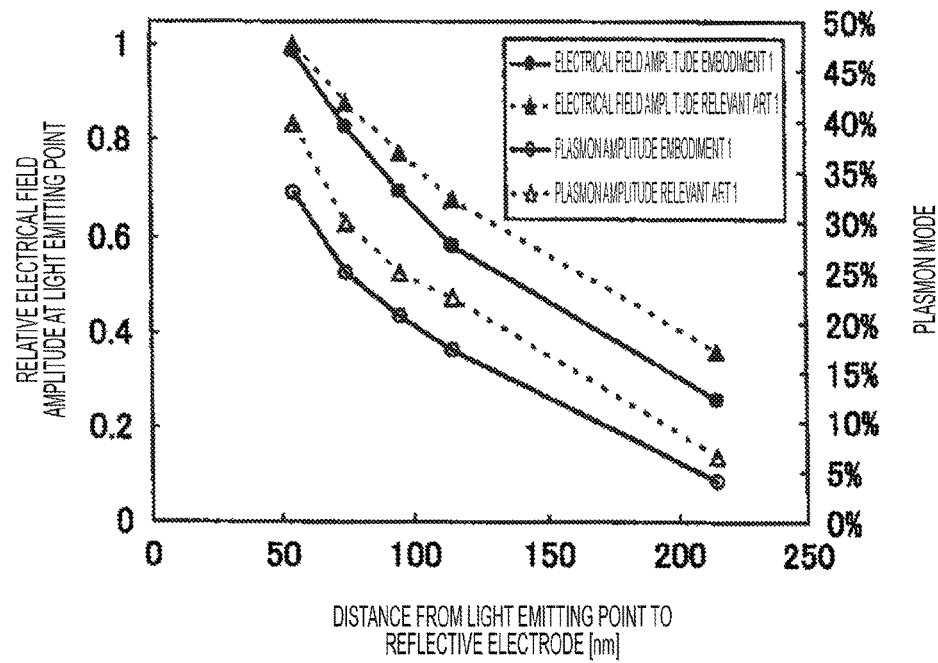
FIG. 12 is a drawing showing the efficiencies of bonding with the relative electrical field amplitude and plasmon mode at the light emission central point in Relevant Art 1 and Embodiment 1.

FIG. 12 is a graph showing the efficiencies of bonding with the electrical field amplitudes and plasmon mode at the light emitting point. It is understood that there is a strong correlation relationship in which the electrical field amplitude at the light emitting point decreased and the efficiency of bonding with the plasmon mode decreased when the distance from the light emitting point to the metal cathode layer 37 was extended. However, in all of the regions, it is possible to further decrease the electrical wave amplitude and to decrease the efficiency of bonding with the plasmon mode in the surface light emitting element 3a in Embodiment 1 as compared to Relevant Art 1.

Meanwhile, the degree of thinness of the metal thin film at which light is transmitted can be represented by using an imaginary part of a refractive index n. In the case when a refractive index n and an extinction coefficient κ are used, a phase change φ and a transmittance T that are generated when passing through a medium having a thickness d are represented by the following formulas (1) and (2).

[Formula 1]

$$\phi = n\frac{2\pi}{\lambda}d \quad (1)$$

[Formula 2]

$$T = \exp\left(-\kappa\frac{4\pi}{\lambda}d\right) \quad (2)$$

In the formulas, λ, is a wavelength of light in vacuum. From the formula (1) a distance Ld at which the intensity of the light is attenuated to half is represented by the following formula (3).

[Formula 3]

$$L_d = \frac{\lambda}{2\pi\kappa} \quad (3)$$

Therefore, in order for the first electrode layer (transparent anode) 33 composed of a metal thin film to have a sufficient transmittance, it is desirable that the first electrode layer is thinner than Ld indicated by the above-mentioned formula (2). In the case when a silver (Ag) film is used as the first electrode layer (transparent anode) 33, it is preferable that the thickness thereof is about 8 nm.

(Embodiment 2: Surface Light Emitting Element 4a)

Figure 13:
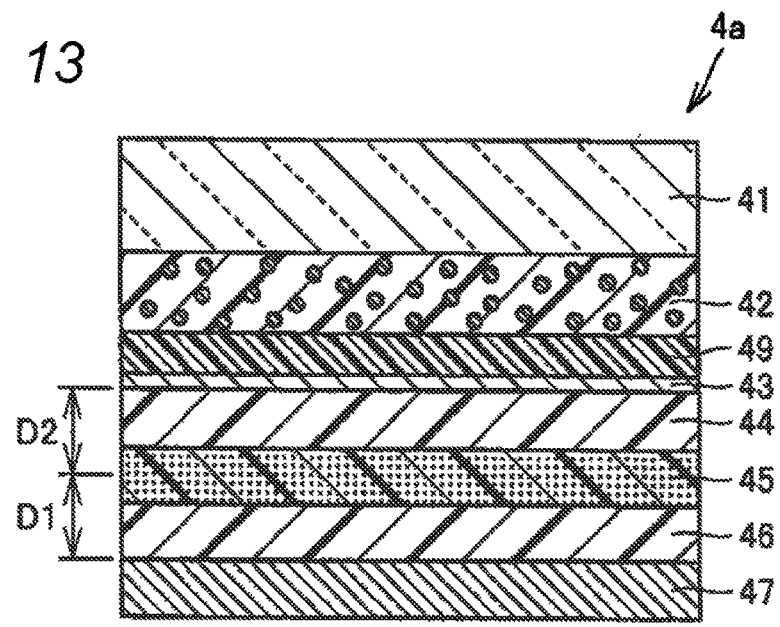
FIG. 13 is a cross-sectional surface view showing the structure of a surface light emitting element in Embodiment 2.

Subsequently, the surface light emitting element 4a in Embodiment 2 will be explained with referring to FIG. 13. FIG. 13 is a cross-sectional surface view showing the structure of a surface light emitting element 4a in Embodiment 2. This surface light emitting element 4a has a basic constitution (material, layer thickness) that is identical with the basic constitution of the surface light emitting element 3a in Embodiment 1 shown in FIG. 3, and includes a light emitting layer 45 that emits light, and a hole transport layer 44 that allows the light that has been emitted by the light emitting layer 45 to pass through, and a first electrode layer (transparent anode) 43, a light scattering layer 42, and a transparent substrate 41, which are laminated in this order on the surface of one side of the light emitting layer 45 (the side from which the light is extracted: the upper side of the drawing).

An electron transport layer 46 and a metal cathode layer (reflective electrode) 47 are laminated in this order on the surface of the other side of the light emitting layer 45 (the side from which light is not extracted: the lower side of the drawing).

The difference from Embodiment 1 is that a primer layer 49 is provided to between the first electrode layer (transparent anode) 43 and the light scattering layer 42. As the primer layer 49, a material that is similar to that of the electrical charge transport layer, an organic material such as polyethylene naphthalate, or an inorganic material such as SiOX can be used. The primer layer 49 has a refractive index n=about 1.7 to 1.9, and a representative value herein is n=1.8. The thickness thereof is, for example, about 30 nm.

In order to provide an ideal shape to the distribution of the plasmon mode, since the shape is also determined by the refractive indices of before and after of the first electrode layer (transparent anode) 43, which is a thin silver anode, optical designing is possible independently from the refractive index of the light scattering layer 42. Furthermore, it is desirable to use a suitable primer layer so as to form the first electrode layer (transparent anode) 43 without unevenness in the production steps, by which it is possible to further improve the properties as the transparent anode of the first electrode layer (transparent anode) 43.

(Embodiment 3: Surface Light Emitting Element 5a)

Figure 14:
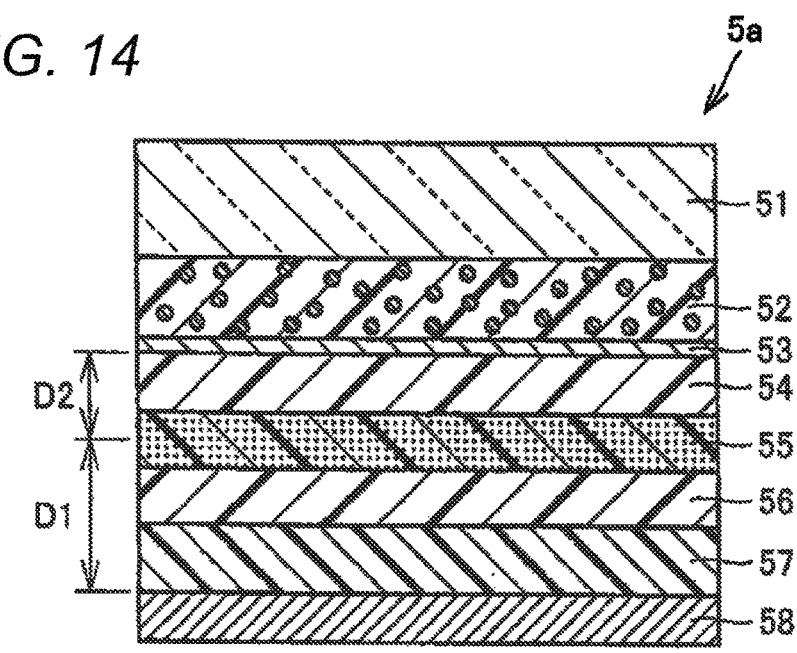
FIG. 14 is a cross-sectional surface view showing the structure of a surface light emitting element in Embodiment 3.

Subsequently, the surface light emitting element 5a in Embodiment 3 will be explained with referring to FIG. 14. FIG. 14 is a cross-sectional surface view showing the structure of the surface light emitting element 5a in Embodiment 3. This surface light emitting element 5a has a basic constitution (material, layer thickness) that is identical with the basic constitution of the surface light emitting element 2a in Relevant Art 2 shown in FIG. 2, and includes a light emitting layer 55 that emits light, and a hole transport layer 54 that allows the light that has been emitted by the light emitting layer 55 to pass through, and a first electrode layer (transparent anode) 53, a light scattering layer 52, and a transparent substrate 51, which are laminated in this order on the surface of one side (the side from which the light is extracted: the upper side of the drawing) of the light emitting layer 55.

An electron transport layer 56, a transparent cathode layer 57 and a light reflective metal layer 58 are laminated in this order on the surface of the other side of the light emitting layer 55 (the side from which light is not extracted: the lower side of the drawing).

The difference from Relevant Art 2 is that a thin silver layer (Ag, thickness: 8 nm) is used for the first electrode layer (transparent anode) 53. It becomes possible to decrease plasmon loss by using the thin silver layer for the first electrode layer (transparent anode) of the surface light emitting element 2a of Relevant Art 2. It becomes possible to attain a better balance of the trade-off between the electrical property and optical property in the surface light emitting element 5a.

(Embodiment 4: Surface Light Emitting Element 6a)

Figure 15:
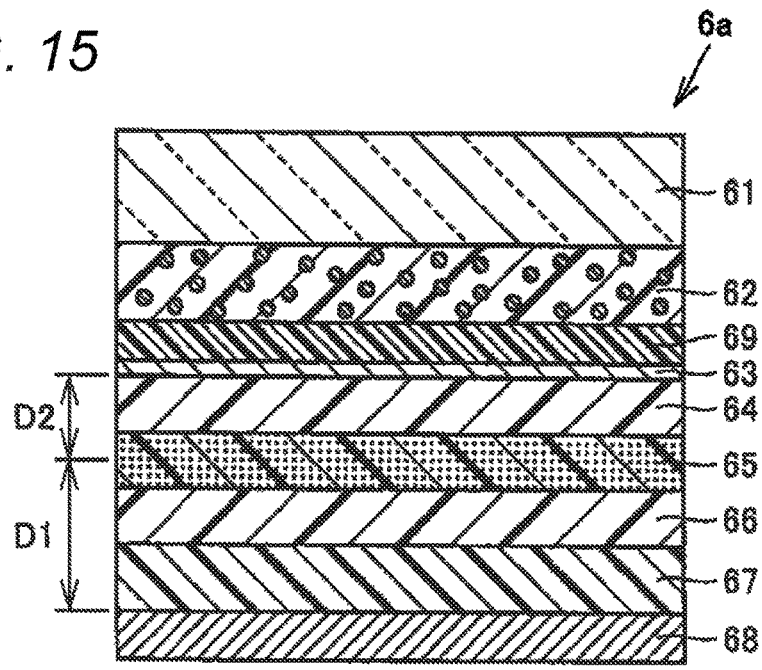
FIG. 15 is a cross-sectional surface view showing the structure of a surface light emitting element in Embodiment 4.

Subsequently, the surface light emitting element 6a in Embodiment 4 will be explained with referring to FIG. 15. FIG. 15 is a cross-sectional surface view showing the structure of the surface light emitting element 6a in Embodiment 4. This surface light emitting element 6a has a basic constitution (material, layer thickness) that is identical with the basic constitution of the surface light emitting element 5a in Embodiment 3 shown in FIG. 14, and includes a light emitting layer 65 that emits light, and a hole transport layer 64 that allows the light that has been emitted by the light emitting layer 65 to pass through, and a first electrode layer (transparent anode) 63, a light scattering layer 62, and a transparent substrate 61, which are laminated in this order on the surface of one side (the side from which the light is extracted: the upper side of the drawing) of the light emitting layer 65.

An electron transport layer 66, a transparent cathode layer 67 and a light reflective metal layer 68 are laminated in this order on the surface of the other side (the side from which light is not extracted: the lower side of the drawing) of the light emitting layer 65.

The difference from Embodiment 3 is that a primer layer 69 is provided to between the first electrode layer (transparent anode) 63 and the light scattering layer 62. The material and layer thickness of this primer layer 69 are identical with those of the primer layer 49 in Embodiment 2.

By this way, actions and effects that are similar to those of Embodiment 2, and of Embodiment 3, can be obtained.

(Embodiment 5: Surface Light Emitting Element 7a)

Figure 16:
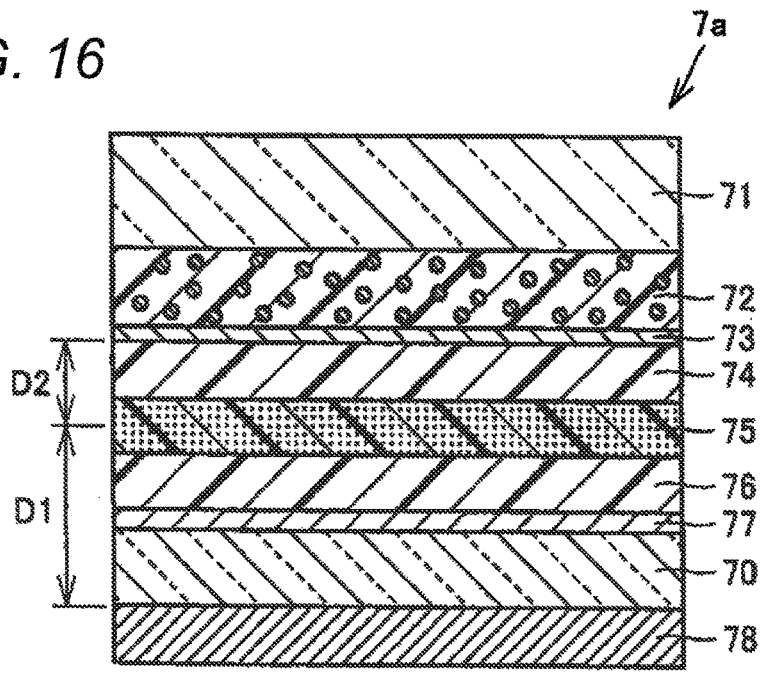
FIG. 16 is a cross-sectional surface view showing the structure of a surface light emitting element in Embodiment 5.

Subsequently, the surface light emitting element 7a in Embodiment 5 will be explained with referring to FIG. 16. FIG. 16 is a cross-sectional surface view showing the structure of the surface light emitting element 7a in Embodiment 5. This surface light emitting element 7a has a basic constitution (material, layer thickness) that is identical with the basic constitution of the surface light emitting element 3a in Embodiment 1 shown in FIG. 3, and includes a light emitting layer 75 that emits light, and a hole transport layer 74 that allows the light that has been emitted by the light emitting layer 75 to pass through, and a first electrode layer (transparent anode) 73, a light scattering layer 72, and a transparent substrate 71, which are laminated in this order on the surface of one side (the side from which the light is extracted: the upper side of the drawing) of the light emitting layer 75.

The difference from Embodiment 1 is that the structure of the surface on the other side (the side from which light is not extracted: the lower side of the drawing) of the light emitting layer 75 is different. An electron transport layer 76, a transparent cathode layer 77, an optical transparent layer 70 and a light reflective metal layer 78 are laminated in this order on the surface on the other side of the light emitting layer 75.

A thin silver layer (Ag, thickness: 8 nm) that is similar to those in the above-mentioned respective Embodiments is used for the transparent cathode layer 77.

For the optical transparent layer 70, a material that is similar to that of the electrical charge transport layer, an organic material such as polyethylene naphthalate, or an inorganic material such as SiOX, SiO2 or Ta2O5 can be used.

By this constitution, the light reflective metal layer 78 can further be distanced from the transparent cathode layer 77 by the optical transparent layer 70, and thus the plasmon loss can further be decreased. It is possible to adopt a constitution to which the optical transparent layer 70 is not provided.

(Embodiment 6: Surface Light Emitting Element 8a)

Figure 17:
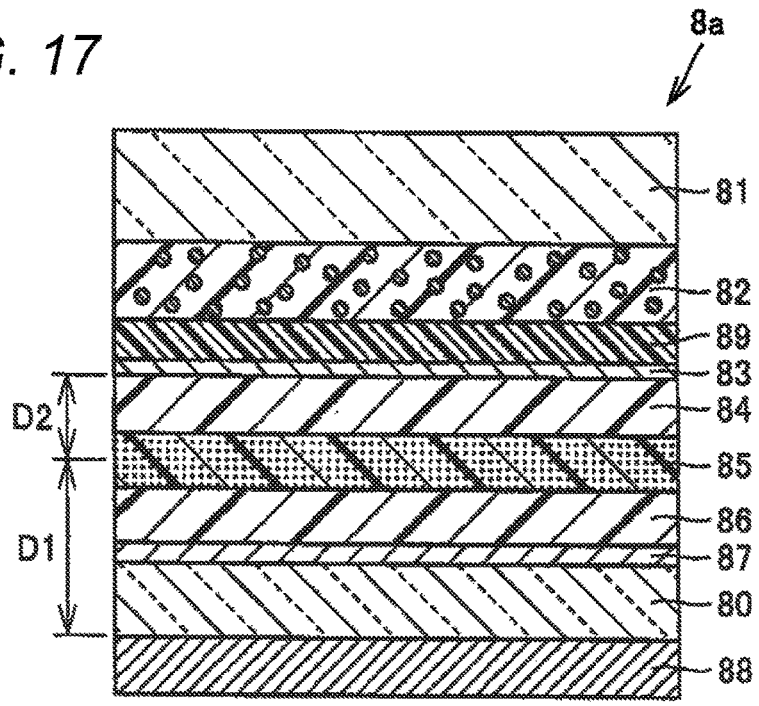
FIG. 17 is a cross-sectional surface view showing the structure of a surface light emitting element in Embodiment 6.

Subsequently, the surface light emitting element 8a in Embodiment 6 will be explained with referring to FIG. 17. FIG. 17 is a cross-sectional surface view showing the structure of the surface light emitting element 8a in Embodiment 6. This surface light emitting element 8a has a basic constitution (material, layer thickness) that is identical with the basic constitution of the surface light emitting element 5a in Embodiment 5 shown in FIG. 16, and includes a light emitting layer 85 that emits light, and a hole transport layer 84 that allows the light that has been emitted by the light emitting layer 85 to pass through, and a first electrode layer (transparent anode) 83, a light scattering layer 82, and a transparent substrate 81, which are laminated in this order on the surface of one side of the light emitting layer 85 (the side from which the light is extracted: the upper side of the drawing).

An electron transport layer 86, a transparent cathode layer 87, an optical transparent layer 80 and a light reflective metal layer 88 are laminated in this order on the surface of the other side of the light emitting layer 85 (the side from which light is not extracted: the lower side of the drawing).

The difference from Embodiment 5 is that a primer layer 89 is provided to between the first electrode layer (transparent anode) 83 and the light scattering layer 82. The material and layer thickness of this primer layer 89 are identical with those of the primer layer 49 in Embodiment 2.

By this way, actions and effects that are similar to those of Embodiment 2, and of Embodiment 5, can be obtained.

(Embodiment 7: Surface Light Emitting Element 9a)

Figure 18:
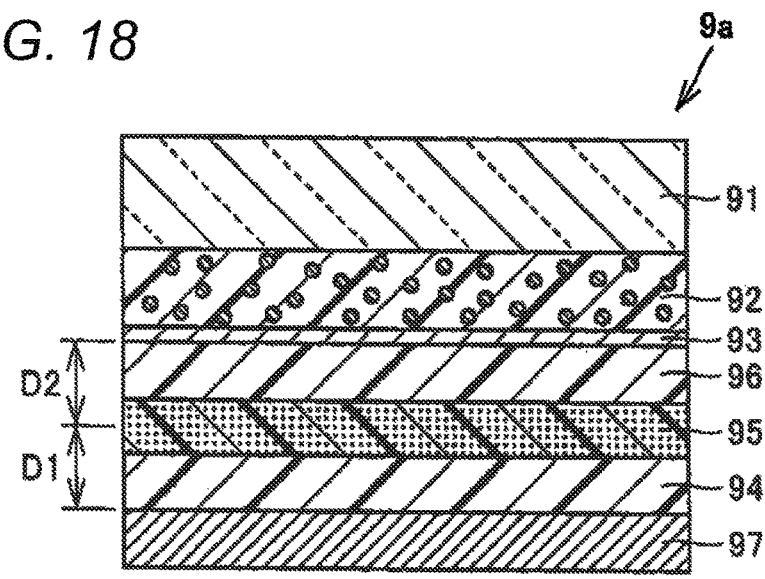
FIG. 18 is a cross-sectional surface view showing the structure of a surface light emitting element in Embodiment 7.

Subsequently, the surface light emitting element 9a in Embodiment 7 will be explained with referring to FIG. 18. FIG. 18 is a cross-sectional surface view showing the structure of the surface light emitting element 9a in Embodiment 7. This surface light emitting element 9a has a basic constitution (material, layer thickness) that is identical with the basic constitution of the surface light emitting element 3a in Embodiment 1, and the difference is a constitution in which the positive-negative constitutions of the electrodes are reversed.

Since ITO is a material suitable for an anode, a constitution such as the surface light emitting element 1a shown in Relevant Art 1 is frequently used as a laminate constitution of a typical order. Although a thin silver layer is used for the first electrode layer (transparent anode) in the above-mentioned respective Embodiments, the thin silver layer can be used as either an anode or a cathode in a relatively easy manner.

As a result, it becomes possible to adopt a constitution in which the positive-negative constitutions of the electrodes are reversed to the constitutions of the above-mentioned respective Embodiments while maintaining the electrical properties, as compared to the constitution of Relevant Art 1 using ITO. The constitution is such that the roles of the anode and cathode are exchanged, and the hole transport layer and the electron transport layer are also exchanged.

Therefore, the surface light emitting element 9a in Embodiment 7 includes a light emitting layer 95 that emits light, and an electron transport layer 96 that allows the light that has been emitted by the light emitting layer 95 to pass through, a first electrode layer (transparent cathode) 93, a light scattering layer 92 and a transparent substrate 91, which are laminated in this order on the surface of one side (the side from which the light is extracted: the upper side of the drawing) of the light emitting layer 95.

A hole transport layer 94 and a metal anode layer (reflective electrode) 97 are laminated in this order on the surface on the other side (the side from which the light is not extracted: the lower side of the drawing) of the light emitting layer 95.

Also by adopting this constitution, the optical property is such that the plasmon loss can be decreased as in the surface light emitting element 3a in Embodiment 1, and it also becomes possible to extract the waveguide mode at the light scattering layer 92.

(Embodiment 8: Surface Light Emitting Element 10a)

Figure 19:
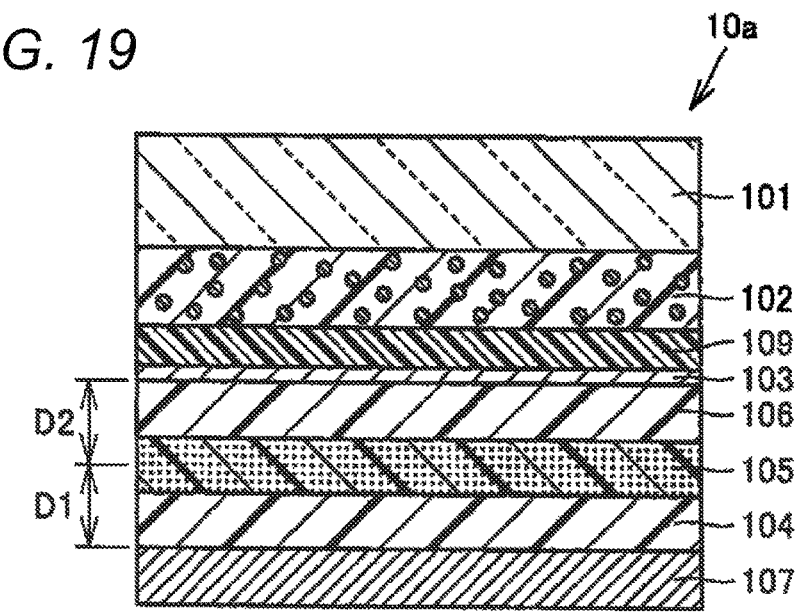
FIG. 19 is a cross-sectional surface view showing the structure of a surface light emitting element in Embodiment 8.

Subsequently, the surface light emitting element 10a in Embodiment 8 will be explained with referring to FIG. 19. FIG. 19 is a cross-sectional surface view showing the structure of the surface light emitting element 10a in Embodiment 8. This surface light emitting element 10a has a basic constitution (material, layer thickness) that is similar to the basic constitution of the surface light emitting element 4a in Embodiment 2. The difference is a constitution in which the positive-negative constitutions of the electrodes are reversed, for a reason that is similar to that shown in the above-mentioned Embodiment 7.

Accordingly, the surface light emitting element 10a in Embodiment 8 includes a light emitting layer 105 that emits light, and an electron transport layer 106 that allows the light that has been emitted by the light emitting layer 105 to pass through, a first electrode layer (transparent cathode) 103, a primer layer 109, a light scattering layer 102 and a transparent substrate 101, which are laminated in this order on the surface of one side (the side from which the light is extracted: the upper side of the drawing) of the light emitting layer 105.

A hole transport layer 104 and a metal anode layer (reflective electrode) 107 are laminated in this order on the other side (the side from which light is not extracted: the lower side of the drawing) of the light emitting layer 105.

Also by adopting this constitution, the optical property is such that the plasmon loss can be decreased as in the surface light emitting element 4a in Embodiment 2, and it also becomes possible to extract the waveguide mode at the light scattering layer 102.

(Embodiment 9: Surface Light Emitting Element 11a)

Figure 20:
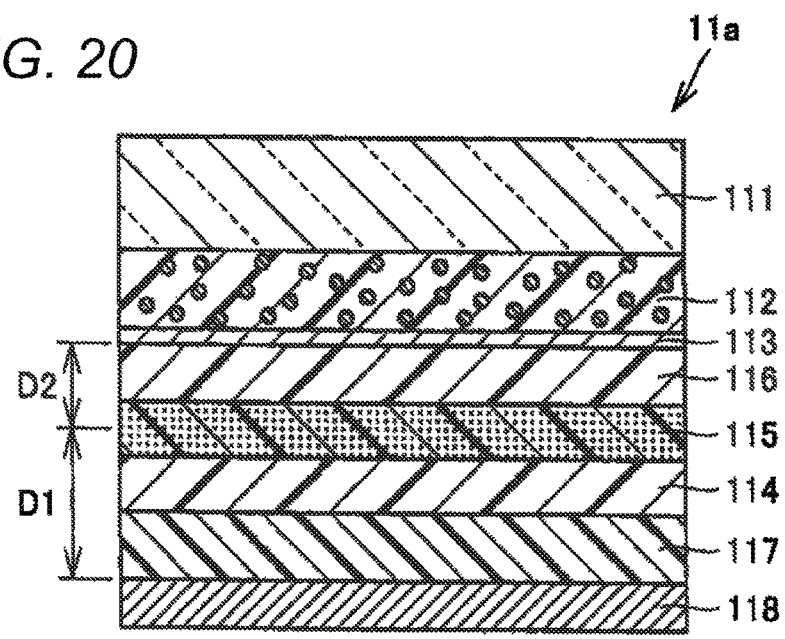
FIG. 20 is a cross-sectional surface view showing the structure of a surface light emitting element in Embodiment 9.

Subsequently, the surface light emitting element 11a in Embodiment 9 will be explained with referring to FIG. 20. FIG. 20 is a cross-sectional surface view showing the structure of the surface light emitting element 11a in Embodiment 9. This surface light emitting element 11a has a basic constitution (material, layer thickness) that is similar to the basic constitution of the surface light emitting element 5a in Embodiment 3. The difference is a constitution in which the positive-negative constitutions of the electrodes are reversed, for a reason that is similar to that shown in the above-mentioned Embodiment 7.

Accordingly, the surface light emitting element 11a in Embodiment 9 includes a light emitting layer 115 that emits light, and an electron transport layer 116 that allows the light that has been emitted by the light emitting layer 115 to pass through, a first electrode layer (transparent cathode) 113, a light scattering layer 112 and a transparent substrate 111, which are laminated in this order on the surface of one side (the side from which the light is extracted: the upper side of the drawing) of the light emitting layer 115.

A hole transport layer 114, a transparent anode layer 117 and a light reflective metal layer 118 are laminated in this order on the other side (the side from which light is not extracted: the lower side of the drawing) of the light emitting layer 115.

Also by adopting this constitution, the optical property is such that the plasmon loss can be decreased as in the surface light emitting element 5a in Embodiment 3, and it also becomes possible to extract the waveguide mode at the light scattering layer 112.

(Embodiment 10: Surface Light Emitting Element 12a)

Figure 21:
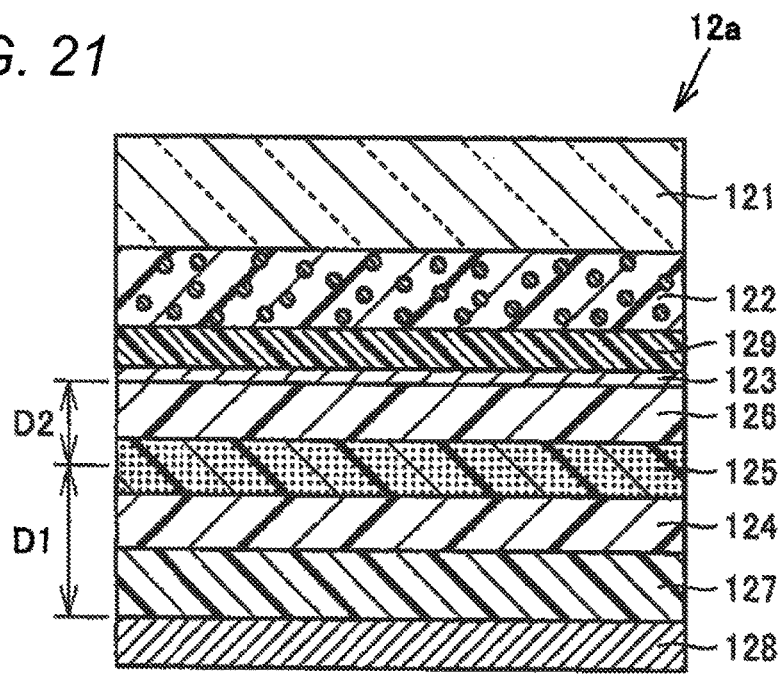
FIG. 21 is a cross-sectional surface view showing the structure of a surface light emitting element in Embodiment 10.

Subsequently, the surface light emitting element 12a in Embodiment 10 will be explained with referring to FIG. 21. FIG. 21 is a cross-sectional surface view showing the structure of the surface light emitting element 12a in Embodiment 10. This surface light emitting element 12a has a basic constitution (material, layer thickness) that is similar to the basic constitution of the surface light emitting element 6a in Embodiment 4. The difference is a constitution in which the positive-negative constitutions of the electrodes are reversed, for a reason that is similar to that shown in the above-mentioned Embodiment 7.

Accordingly, the surface light emitting element 12a in Embodiment 10 includes a light emitting layer 125 that emits light, and an electron transport layer 126 that allows the light that has been emitted by the light emitting layer 125 to pass through, a first electrode layer (transparent cathode) 123, a primer layer 129, a light scattering layer 122, and a transparent substrate 121, which are laminated in this order on the surface of one side (the side from which the light is extracted: the upper side of the drawing) of the light emitting layer 125.

A hole transport layer 124, a transparent anode layer 127 and a light reflective metal layer 128 are laminated in this order on the other side (the side from which light is not extracted: the lower side of the drawing) of the light emitting layer 125.

Also by adopting this constitution, the optical property is such that the plasmon loss can be decreased as in the surface light emitting element 6a in Embodiment 4, and it also becomes possible to extract the waveguide mode at the light scattering layer 112.

(Embodiment 11: Surface Light Emitting Element 13a)

Figure 22:
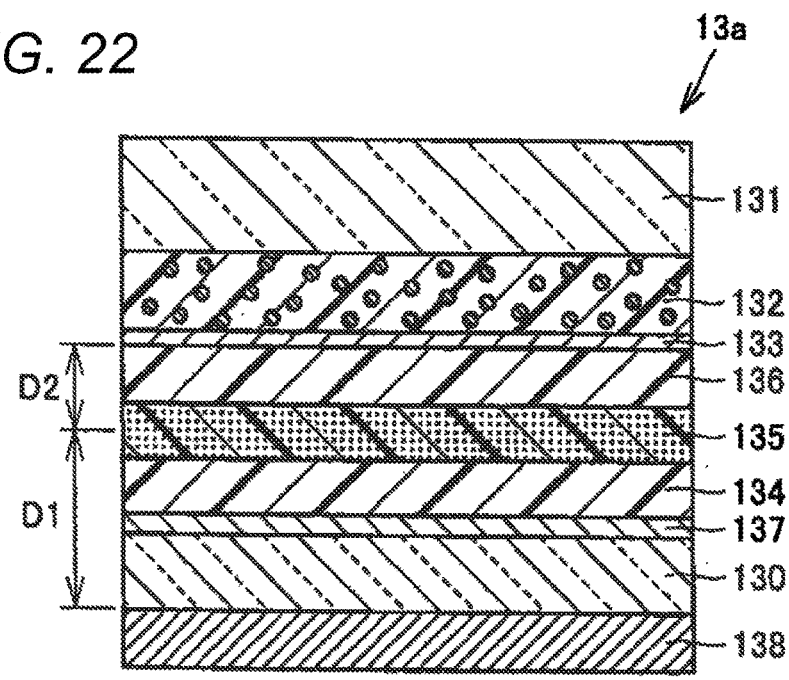
FIG. 22 is a cross-sectional surface view showing the structure of a surface light emitting element in Embodiment 11.

Subsequently, the surface light emitting element 13a in Embodiment 11 will be explained with referring to FIG. 22. FIG. 22 is a cross-sectional surface view showing the structure of the surface light emitting element 13a in Embodiment 11. This surface light emitting element 13a has a basic constitution (material, layer thickness) that is similar to the basic constitution of the surface light emitting element 7a in Embodiment 5. The difference is a constitution in which the positive-negative constitutions of the electrodes are reversed, for a reason that is similar to that shown in the above-mentioned Embodiment 7.

Accordingly, the surface light emitting element 13a in Embodiment 11 includes a light emitting layer 135 that emits light, and an electron transport layer 136 that allows the light that has been emitted by the light emitting layer 135 to pass through, a first electrode layer (transparent cathode) 133, a light scattering layer 132 and a transparent substrate 131, which are laminated in this order on the surface of one side (the side from which the light is extracted: the upper side of the drawing) of the light emitting layer 135.

A hole transport layer 134, a transparent anode layer 137, an optical transparent layer 130 and a light reflective metal layer 138 are laminated in this order on the other side (the side from which light is not extracted: the lower side of the drawing) of the light emitting layer 135.

Also by adopting this constitution, the optical property is such that the plasmon loss can be decreased as in the surface light emitting element 7a in Embodiment 5, and it also becomes possible to extract the waveguide mode at the light scattering layer 132.

(Embodiment 12: Surface Light Emitting Element 14a)

Figure 23:
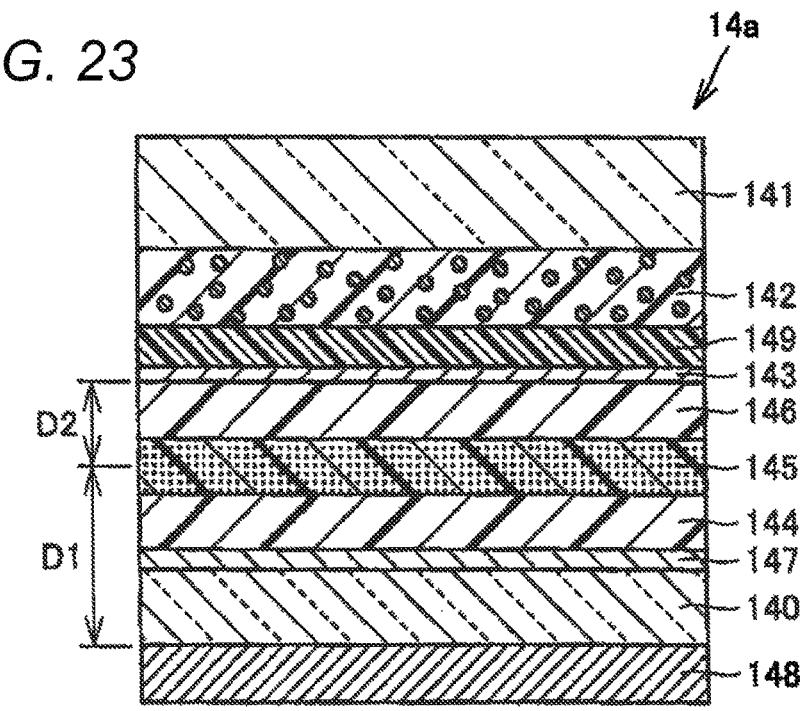
FIG. 23 is a cross-sectional surface view showing the structure of a surface light emitting element in Embodiment 12.

Subsequently, the surface light emitting element 14a in Embodiment 12 will be explained with referring to FIG. 23. FIG. 23 is a cross-sectional surface view showing the structure of the surface light emitting element 14a in Embodiment 12. This surface light emitting element 14a has a basic constitution (material, layer thickness) that is similar to the basic constitution of the surface light emitting element 8a in Embodiment 6. The difference is a constitution in which the positive-negative constitutions of the electrodes are reversed, for a reason that is similar to that shown in the above-mentioned Embodiment 7.

Accordingly, the surface light emitting element 14a in Embodiment 12 includes a light emitting layer 145 that emits light, and an electron transport layer 146 that allows the light that has been emitted by the light emitting layer 145 to pass through, and a first electrode layer (transparent cathode) 143, a primer layer 149, a light scattering layer 142 and a transparent substrate 141, which are laminated in this order on the surface of one side (the side from which the light is extracted: the upper side of the drawing) of the light emitting layer 145.

A hole transport layer 144, a transparent anode layer 147, an optical transparent layer 140 and a light reflective metal layer 148 are laminated in this order on the other side (the side from which light is not extracted: the lower side of the drawing) of the light emitting layer 145.

Also by adopting this constitution, the optical property is such that the plasmon loss can be decreased as in the surface light emitting element 8a in Embodiment 6, and it also becomes possible to extract the waveguide mode at the light scattering layer 142.

(Embodiment 13: Surface Light Emitting Element 15a)

Figure 24:
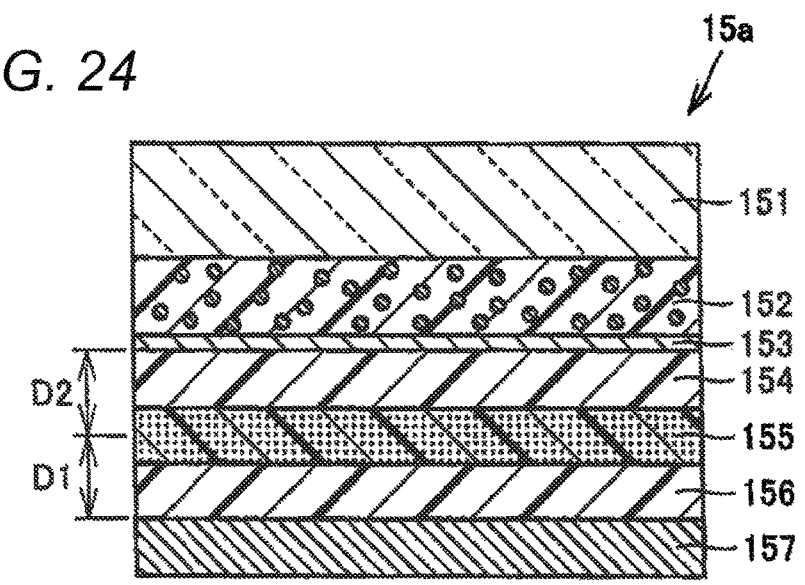
FIG. 24 is a cross-sectional surface view showing the structure of a surface light emitting element in Embodiment 13.

Subsequently, the surface light emitting element 15a in Embodiment 13 will be explained with referring to FIG. 24. FIG. 24 is a cross-sectional surface view showing the structure of the surface light emitting element 15a in Embodiment 13. This surface light emitting element 15a has a basic constitution (material, layer thickness) that is similar to the basic constitution of the surface light emitting element 3a in Embodiment 1. The difference is that not silver but silver magnesium is used as the material for the first electrode layer (transparent anode). Silver magnesium is also a conductive material in which the real part of a complex dielectric constant is negative as in silver, and has equivalent properties.

Accordingly, the surface light emitting element 15a in Embodiment 13 includes a light emitting layer 155 that emits light, and a hole transport layer 154 that allows the light that has been emitted by the light emitting layer 155 to pass through, a first electrode layer (transparent anode) 153, a light scattering layer 152 and a transparent substrate 151, which are laminated in this order on the surface of one of the light emitting layer 155 (the side from which the light is extracted: the upper side of the drawing).

An electron transport layer 156 and a metal cathode layer (reflective electrode) 157 are laminated in this order on the surface on the other side (the side from which light is not extracted: the lower side of the drawing) of the light emitting layer 155.

Also by adopting this constitution, the optical property is such that the plasmon loss can be decreased as in the surface light emitting element 3a in Embodiment 1, and it also becomes possible to extract the waveguide mode at the light scattering layer 152.

As shown in the above-mentioned Embodiments 7 to 12, it is also possible to adopt a constitution in which the positive-negative constitutions of the electrodes are reversed.

(Embodiment 14: Surface Light Emitting Element 16a)

Figure 25:
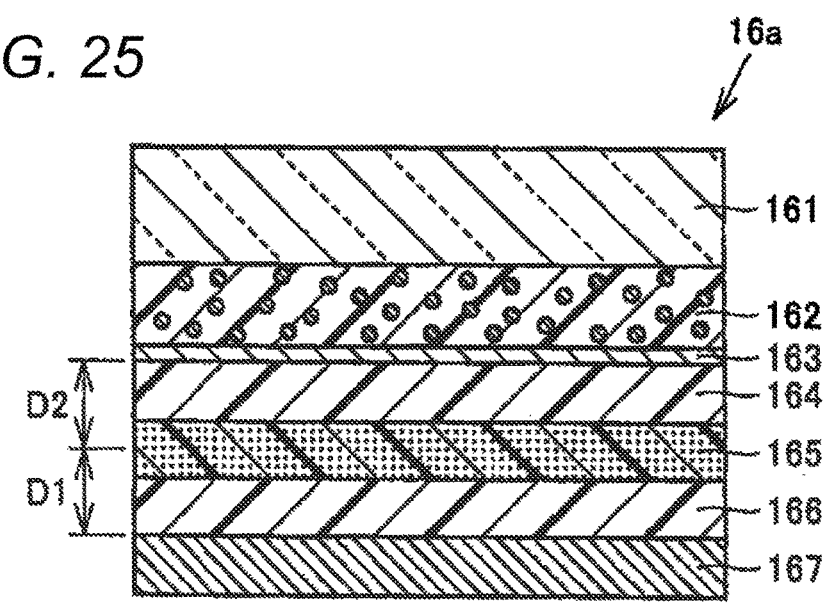
FIG. 25 is a cross-sectional surface view showing the structure of a surface light emitting element in Embodiment 14.

Subsequently, the surface light emitting element 16a in Embodiment 14 will be explained with referring to FIG. 25. FIG. 25 is a cross-sectional surface view showing the structure of the surface light emitting element 16a in Embodiment 14. This surface light emitting element 16a has a basic constitution (material, layer thickness) that is similar to the basic constitution of the surface light emitting element 3a in Embodiment 1. The difference is that not silver but gold is used as the material for the first electrode layer (transparent anode). Gold is also a conductive material in which the real part of a complex dielectric constant is negative as in silver, and has equivalent properties.

Accordingly, the surface light emitting element 16a in Embodiment 14 includes a light emitting layer 165 that emits light, and a hole transport layer 164 that allows the light that has been emitted by the light emitting layer 165 to pass through, a first electrode layer (transparent cathode) 163, a light scattering layer 162 and a transparent substrate 161, which are laminated in this order on the surface of one side (the side from which the light is extracted: the upper side of the drawing) of the light emitting layer 165.

An electron transport layer 166 and a metal cathode layer (reflective electrode) 167 are laminated in this order on the surface on the other side (the side from which light is not extracted: the lower side of the drawing) of the light emitting layer 165.

Also by adopting this constitution, the optical property is such that the plasmon loss can be decreased as in the surface light emitting element 3a in Embodiment 1, and it also becomes possible to extract the waveguide mode at the light scattering layer 162.

As shown in the above-mentioned Embodiments 7 to 12, it is also possible to adopt a constitution in which the positive-negative constitutions of the electrodes are reversed.

(Light Extraction Efficiency)

FIG. 26 shows the light extraction efficiencies of the respective surface light emitting elements in the above-mentioned Relevant Arts 1 and 2, and Embodiments 1 to 14. In Relevant Arts 1 and 2, either of the light extracting efficiencies was lower than 40%, whereas in the respective surface light emitting elements of Embodiments 1 to 14, it was able to be confirmed that it was possible to improve the light extracting efficiencies to be 40% or more in all cases.

In either of the above-mentioned respective Embodiments, the distance D1 from the central position of the light emitting layer to the surface of the second electrode layer on the side of the light emitting layer was preset to be longer than the distance D2 from the central position of the light emitting layer to the surface of the first electrode layer on the side of the light emitting layer.

The light extraction efficiency was 49% in the surface light emitting elements of Embodiments 1, 2, 7, 8, 13 and 14, in which the distance D1 from the central position of the light emitting layer to the surface of the second electrode layer on the side of the light emitting layer was lower than 100 nm, and thus the light extraction efficiencies of these embodiments were superior to the light extraction efficiencies of the surface light emitting elements of the other embodiments.

According to the surface light emitting element in this embodiment, a thin metal is used as the transparent electrode on the side from which light is extracted. By this way, it becomes possible to decrease plasmon loss as compared to general first electrode layers (transparent electrodes) such as ITO.

In a surface light emitting element using ITO and the surface light emitting element in this embodiment, if light loss of a similar degree is allowed, then the distance from the light emitting layer to the reflective electrode can be shorten. Consequently, the electrical properties can be improved. The light at the waveguide mode that is enclosed in the emitting layer and transparent electrode can be extracted at the adjacent high refractive index scattering layer into the substrate and the air.

In the respective surface light emitting elements explained above in details, a surface light emitting element, including: a light emitting layer that emits light; a first electrode layer that is provided on the side of the light emitting layer from which the light is extracted and allows the light that has been emitted by the light emitting layer to pass through; a second electrode layer that is provided on the side of the light emitting layer from which light is not extracted; alight scattering layer that is provided on the side of the first electrode layer opposite to the side on which the light emitting layer is positioned; and a transparent substrate that is provided on the side of the light scattering layer opposite to the side on which the light emitting layer is positioned, wherein a conductive material in which the real part of a complex dielectric constant is negative is used in the first electrode layer, is used.

The above-mentioned conductive material in which the real part of a complex dielectric constant is negative can be formed of a metal. The above-mentioned metal can be formed of silver or an alloy containing silver as a main component.

The above-mentioned light scattering layer can be constituted by a layer having a higher refractive index than the refractive index of the above-mentioned transparent substrate. Furthermore, the above-mentioned second electrode layer can be constituted so as to include a transparent electrode layer that is provided to the side of the above-mentioned light emitting layer, and a light reflective metal layer that is provided to the side of the above-mentioned transparent electrode layer opposite to the side on which the above-mentioned light emitting layer is positioned.

Furthermore, it is possible to constitute so that an optical transparent layer is further included between the above-mentioned transparent electrode layer and the above-mentioned light reflective metal layer.

Furthermore, the above-mentioned transparent electrode layer can be constituted by the above-mentioned conductive material in which the real part of a complex dielectric constant is negative. Furthermore, it is possible to constitute so that the above-mentioned first electrode layer and the above-mentioned light scattering layer further includes a primer layer that allows light to pass through therebetween.

Furthermore, it is possible to constitute so that the distance from the central position of the above-mentioned light emitting layer to the surface of the above-mentioned second electrode layer on the side of the above-mentioned light emitting layer is longer than the distance from the central portion of the above-mentioned light emitting layer to the surface of the above-mentioned first electrode layer on the side of the above-mentioned light emitting layer.

Furthermore, it is possible to constitute so that the distance from the central position of the above-mentioned light emitting layer to the surface of the above-mentioned second electrode layer on the side of the above-mentioned light emitting layer is lower than 100 nm.

According to the above-mentioned respective constitutions, a surface light emitting element having a structure by which a light extraction efficiency can be improved can be provided.

The surface light emitting elements in the respective embodiments of the present invention have been explained above, but it should be considered that the embodiments disclosed at this time are for exemplification in all points and thus are not restrictive embodiments. Accordingly, it is intended that the scope of the present invention is indicated by the claims, and that all changes within meanings and scopes that are equivalent to those of the claims are encompassed.

The invention claimed is:

1. A surface light emitting element, comprising:
   a light emitting layer that emits light;
      a first electrode layer that is provided on the side of the light emitting layer from which the light is extracted and allows the light that has been emitted by the light emitting layer to pass through;
      a second electrode layer that is provided on the side of the light emitting layer from which light is not extracted;
   a light scattering layer that is provided on the side of the first electrode layer opposite to the side on which the light emitting layer is positioned; and
      a transparent substrate that is provided on the side of the light scattering layer opposite to the side on which the light emitting layer is positioned,
      wherein a conductive material in which a real part of a complex dielectric constant is negative is used in the first electrode layer; and
      wherein the first electrode layer has a thickness less than $$\frac{\lambda}{2\pi\kappa},$$

where κ is an extinction coefficient of the conductive material and λ is a wavelength of the light in a vacuum; and wherein the distance from the central position of the light emitting layer to the surface of the second electrode layer on the side of the light emitting layer is at least twice as long as the distance from the central portion of the light emitting layer to the surface of the first electrode layer on the side of the light emitting layer.

2. The surface light emitting element according to claim 1, wherein the conductive material in which the real part of a complex dielectric constant is negative is a metal.

3. The surface light emitting element according to claim 2, wherein the metal is silver or an alloy containing silver as a main component.

4. The surface light emitting element according to claim 1, wherein the light scattering layer is a layer having a higher refractive index than the refractive index of the transparent substrate.

5. The surface light emitting element according to claim 1, wherein the second electrode layer includes:
   a transparent electrode layer that is provided to the side of the light emitting layer, and
   a light reflective metal layer that is provided to the side of the transparent electrode layer opposite to the side on which the light emitting layer is positioned.

6. The surface light emitting element according to claim 5, which further includes an optical transparent layer between the transparent electrode layer and the light reflective metal layer.

7. The surface light emitting element according to claim 5, wherein the transparent electrode layer is the metal in which the real part of a complex dielectric constant is negative.

8. The surface light emitting element according to claim 1, which further comprises a primer layer that allows light to pass through between the first electrode layer and the light scattering layer.

9. The surface light emitting element according to claim 1, wherein the distance from the central position of the light emitting layer to the surface of the second electrode layer on the side of the light emitting layer is lower than 100 nm.

* * * * *